US010752991B2

(12) United States Patent
Shono

(10) Patent No.: US 10,752,991 B2
(45) Date of Patent: Aug. 25, 2020

(54) HALF-ANGLE NOZZLE

(71) Applicant: Applied Materials, Inc., Santa Clara, CA (US)

(72) Inventor: Eric Kihara Shono, San Mateo, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 321 days.

(21) Appl. No.: 15/877,048

(22) Filed: Jan. 22, 2018

(65) Prior Publication Data

US 2018/0223426 A1 Aug. 9, 2018

Related U.S. Application Data

(60) Provisional application No. 62/455,282, filed on Feb. 6, 2017.

(51) Int. Cl.
*C23C 16/40* (2006.01)
*C23C 16/455* (2006.01)
(Continued)

(52) U.S. Cl.
CPC .... *C23C 16/45502* (2013.01); *C23C 16/4584* (2013.01); *C23C 16/45563* (2013.01);
(Continued)

(58) Field of Classification Search
CPC ........ C23C 16/45502; C23C 16/45563; C23C 16/4584; C23C 16/45578;
(Continued)

(56) References Cited

U.S. PATENT DOCUMENTS 6,820,570 B2   11/2004   Kilpela et al.
7,037,560 B1    5/2006   Shinriki et al.
(Continued)

FOREIGN PATENT DOCUMENTS

| TW | 576768 B | 2/2004 |
| TW | 201336591 A | 9/2013 |
| TW | 201538782 A | 10/2015 |

OTHER PUBLICATIONS

Taiwan Office Action dated Nov. 12, 2019 for Application No. 107103148.

(Continued)

*Primary Examiner* — Rudy Zervigon
(74) *Attorney, Agent, or Firm* — Patterson + Sheridan LLP

(57) ABSTRACT

Implementations of the present disclosure provide an apparatus for improving gas distribution during thermal processing. One implementation of the present disclosure provides an apparatus for thermal processing a substrate. The apparatus includes a body, an angled gas source assembly, and a gas injection channel. The gas injection channel has a first half-angle and a second half-angle. The first half-angle is different from the second half-angle. The use of an improved side gas assembly in a processing chamber to direct gas towards the edge of the substrate advantageously controls growth uniformity throughout the substrate, i.e., from the center to the edge. Surprisingly, directing gas through a gas channel with non-uniform half-angles will significantly increase the reaction at or near the edge of the substrate, thereby leading to an improved overall thickness uniformity of the substrate.

20 Claims, 5 Drawing Sheets

(51) Int. Cl.
*H01L 21/67* (2006.01)
*C23C 16/458* (2006.01)
*C30B 25/14* (2006.01)

(52) U.S. Cl.
CPC ........ *C23C 16/45578* (2013.01); *C30B 25/14* (2013.01); *H01L 21/67017* (2013.01); *H01L 21/67109* (2013.01); *H01L 21/67115* (2013.01)

(58) Field of Classification Search
CPC ......... H01L 21/67115; H01L 21/67017; H01L 21/67109; C30B 25/14
USPC .................... 118/715; 156/345.33, 345.34
See application file for complete search history.

(56) References Cited

U.S. PATENT DOCUMENTS

| | | |
|---|---|---|
| 8,056,500 B2 | 11/2011 | Tseng et al. |
| 8,211,230 B2 | 7/2012 | Verghese et al. |
| 2004/0221807 A1 | 11/2004 | Verghese et al. |
| 2006/0266289 A1* | 11/2006 | Verghese ............ C23C 16/4586 118/715 |
| 2007/0084406 A1 | 4/2007 | Yudovsky et al. |
| 2009/0163042 A1* | 6/2009 | Tseng ................ H01L 21/67017 438/795 |
| 2009/0178611 A1 | 7/2009 | Arena et al. |

OTHER PUBLICATIONS

Taiwan Office Action dated Jun. 11, 2019 for Application No. 107103148.

* cited by examiner

HALF-ANGLE NOZZLE

CROSS-REFERENCE TO RELATED APPLICATIONS

This application claims benefit of U.S. provisional patent application Ser. No. 62/455,282, filed Feb. 6, 2017, which is herein incorporated by reference.

BACKGROUND

Field

The present disclosure relates generally to a semiconductor processing tool and, more specifically, to a reactor with improved gas flow distribution.

Description of the Related Art

Semiconductor substrates are processed for a wide variety of applications, including the fabrication of integrated devices and microdevices. One method of processing substrates includes growing an oxide layer on an upper surface of the substrate sitting within a processing chamber. The oxide layer may be deposited by exposing the substrate to oxygen and hydrogen gases while heating the substrate with a radiant heat source. The oxygen radicals strike the surface of the substrate to form a layer, for example a silicon dioxide layer, on a silicon substrate.

Current processing chamber used for rapid thermal oxidation have limited growth control, resulting in poor processing uniformity. Conventionally, a rotatable substrate support rotates a substrate while a reactant gas is introduced parallel to a horizontal direction of the substrate so that a film is deposited on the substrate set on the substrate support. Current gas inlet designs result in gas reaching the substrate and depositing non-uniformly throughout the substrate. The limited growth control due to the current gas inlet designs results in greater growth at the center of the substrate, and poor growth at the edges of the substrate.

Therefore, there is a need for an improved gas flow distribution that provides growth control for more uniform growth throughout the substrate.

SUMMARY

Implementations of the present disclosure provide apparatus for improving gas distribution during thermal processing. One implementation of the present disclosure provides an apparatus for thermal processing a substrate. The apparatus includes a body, an angled projection, and a gas injection channel. The gas injection channel has a first half-angle and a second half-angle. The first half-angle is different from the second half-angle.

Another implementation of the present disclosure provides an apparatus for processing a substrate comprising a chamber body defining a processing volume and a substrate support disposed in the processing volume. The substrate support has a substrate supporting surface. The apparatus also includes a gas source projection coupled to an inlet of the chamber body, an exhaust assembly coupled to an outlet of the chamber body, and a side gas assembly coupled to a sidewall of the chamber body. The side gas assembly includes a gas injection channel. The gas injection inlet includes a first half-angle and a second half-angle. The first half-angle is different from the second half-angle.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1A:
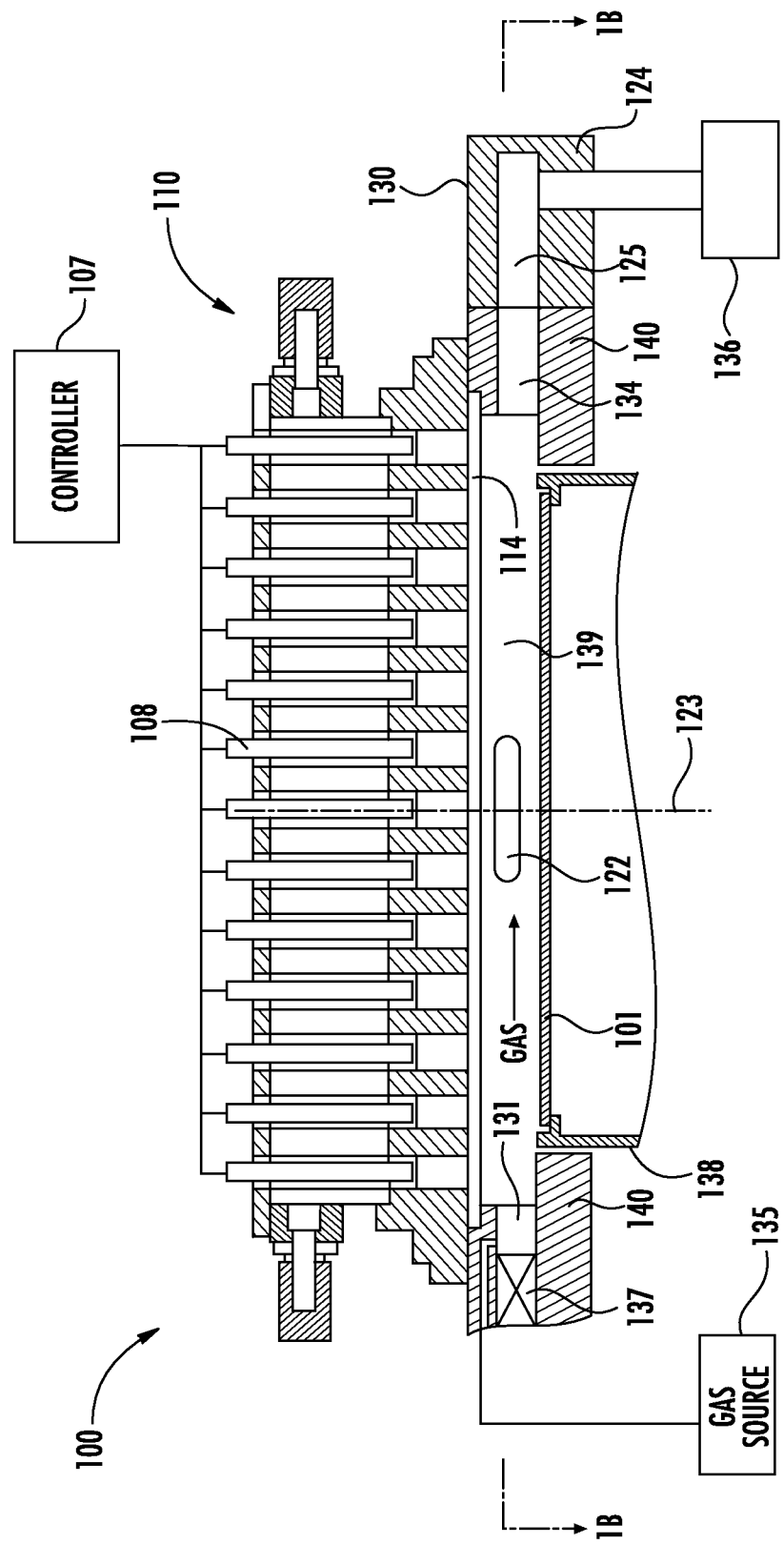
FIG. 1A is a schematic, cross-sectional representation of a thermal processing chamber that may be used to practice implementations of the present disclosure.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

FIG. 1A is a schematic, cross-sectional representation of a thermal processing chamber 100 that may be used to practice implementations of the present disclosure. The thermal processing chamber 100 generally includes a lamp assembly 110, a chamber assembly 130 defining a processing volume 139, and a substrate support 138 disposed in the processing volume 139. The processing chamber 100 is capable of providing a controlled thermal cycle that heats a substrate 101 for processes such as, for example, thermal annealing, thermal cleaning, thermal chemical vapor deposition, thermal oxidation and thermal nitridation, etc.

The lamp assembly 110 may be positioned relatively above the substrate support 138 to supply heat to the processing volume 139 via a quartz window 114. The quartz window 114 is disposed between the substrate 101 and the lamp assembly 110. The lamp assembly 110 may additionally or alternatively be disposed relatively below the substrate support 138 in some implementations. It is noted that the term "above" or "below" as used in this disclosure are not referring to absolute directions. The lamp assembly 110 is configured to house a heating source 108, such as a plurality of tungsten-halogen lamps for providing a tailored infrared heating means to a substrate 101 disposed on the substrate support 138. The plurality of tungsten-halogen lamps may be disposed in a hexagonal arrangement. The heating source 108 may be connected to a controller 107 which may control the energy level of the heating source 108 to achieve a uniform or tailored heating profile to the substrate 101. In one example, the heating source 108 is capable of rapidly heating the substrate 101 at a rate of from about 50° C./s to about 280° C./s.

The substrate 101 may be heated to a temperature ranging from about 550 degrees Celsius to about less than 700 degrees Celsius. The heating source 108 may provide zoned heating (temperature tuning) of the substrate 101. Temperature tuning may be performed to change the temperature of the substrate 101 at certain locations while not affecting the rest of the substrate temperature. A slit valve 137 may be disposed on the base ring 140 for a robot to transfer the substrate 101 into and out of the processing volume 139. The substrate 101 may be placed on the substrate support 138, which may be configured to move vertically and to rotate about a central axis 123. A gas inlet 131 may be disposed over the base ring 140 and connected to a gas source 135 to provide one or more processing gases to the processing volume 139. A gas outlet 134, formed on an opposite side of the base ring 140 from the gas inlet 131, is adapted to an exhaust assembly 124 which is in fluid communication with a pump system 136. The exhaust assembly 124 defines an exhaust volume 125, which is in fluid communication with the processing volume 139 via the gas outlet 134.

In one implementation, one or more side ports 122 may be formed over the base ring 140 between the gas inlet 131 and the gas outlet 134. The side port 122, the gas inlet 131, and the gas outlet 134 may be disposed at substantially the same level. That is, the side port 122, the gas inlet 131, and the gas outlet 134 may be at substantially the same level. As will be discussed in more detail below, the side port 122 is connected to a side gas source configured to improve gas distribution uniformity near edge areas of the substrate 101.

Figure 1B:
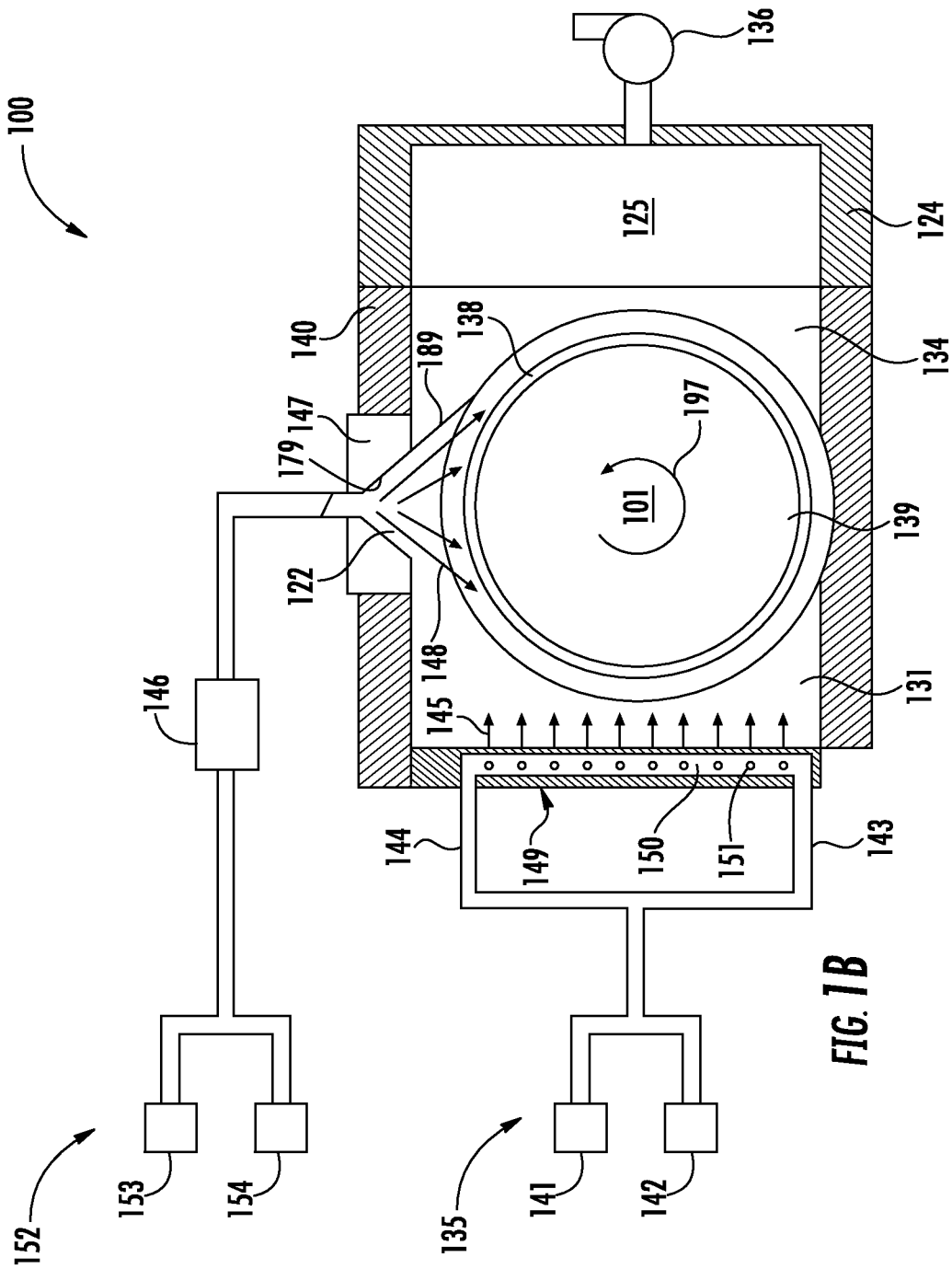
FIG. 1B is a schematic cross-sectional top view of the thermal processing chamber according to one implementation of the present disclosure.

FIG. 1B is a schematic cross-sectional top view of the thermal processing chamber 100 according to one implementation of the present disclosure. As shown in FIG. 1B, the gas inlet 131 and gas outlet 134 are disposed on opposite sides of the processing volume 139. Both of the gas inlet 131 and the gas outlet 134 may have a linear or azimuthal width which approximately equals a diameter of the substrate support 138.

In one implementation, the gas source 135 may comprise multiple gas sources, for example a first gas source 141, and a second gas source 142, each configured to provide a processing gas connected to an injection cartridge 149. Gas flows through from the first gas source 141 and the second gas source 142, through the injection cartridge 149 and the gas inlet 131 into the processing volume 139. In one implementation, the injection cartridge 149 has an elongated channel 150 formed therein and two inlets 143, 144 formed on opposite ends of the elongated channel 150. A plurality of injecting holes 151 are distributed along the elongated channel 150 and are configured to inject a main gas flow 145 towards the processing volume 139. The two-inlet design of the cartridge 149 improves gas flow uniformity in the processing volume 139. The main gas flow 145 may include 30 to 50 percent hydrogen gas by volume and 50 to 70 percent oxygen gas by volume, and have a flow rate ranging from about 20 standard liters per minute (slm) to about 50 slm. The flow rate is based on the substrate 101 having a 300 mm diameter, which leads to a flow rate ranging from about 0.028 slm/cm$^2$ to about 0.071 slm/cm$^2$.

The main gas flow 145 is directed from the gas inlet 131 towards the gas outlet 134 and to the pump 136, which is a vacuum source for the chamber 100. In one implementation, the exhaust volume 125 of the exhaust assembly 124 is configured to extend the processing volume 139 to reduce the geometry influence of the chamber structure on the main gas flow 145. The pump 136 may be also used to control the pressure of the processing volume 139. In one exemplary operation, the pressure inside the processing volume is maintained at about 1 Torr to about 19 Torr, such as between about 5 Torr to about 15 Torr.

In one implementation, a gas injector 147 is coupled to the base ring 140 so that a gas is flowed along a side gas flow 148 to the processing volume 139 via the side port 122. The gas injector 147 is in fluid communication with a gas source 152 via a flow adjusting device 146 configured to control a flow rate of the side gas flow 148. The gas source 152 may include one or more gas sources 153, 154. In one exemplary example, the gas source 152 is a remote plasma source (RPS) that produces hydrogen radicals to the side port 122. For a RadOx® process that heats the substrate with lamps and injects hydrogen and oxygen into the processing chamber 100 from the slit valve 137, the gas injector 147 is configured to inject the hydrogen radicals into the processing volume 139. The hydrogen radicals introduced from the gas injector 147 improve the reaction rate along the edge of the substrate 101, leading to an oxide layer having improved thickness uniformity. The side gas flow 148 may have a flow rate ranging from about 5 slm to about 25 slm. For a substrate with a 300 mm diameter, the flow rate ranges from about 0.007 slm/cm$^2$ to about 0.035 slm/cm$^2$. The composition and the flow rate of the side gas flow 148 are important factors in forming an oxide layer having improved thickness uniformity.

In the implementation shown in FIG. 1B, the gas injector 147 is a structure with an funnel-like opening which spreads out towards the processing volume 139. That is, the side port 122 has an inner diameter that increases gradually toward the substrate 101. The gas injector 147 is adapted to direct the majority of the side gas flow 148 to the edge of the substrate 101 in the shape of a hollow fan or hollow flattened cone. The edge of the substrate 101 may refer to the peripheral region measuring from 0 mm to 15 mm, for example 10 mm, from the edge of the substrate 101. Since the funnel-shaped structure of the gas injector 147 spreads out the majority of the side gas flow 148 aiming at the edge of the substrate 101, the gas exposure of the substrate 101 is increased at or near the edge area. In one implementation, the inner surface 179 of the gas injector 147 is configured so that it extends along a direction 189 that is substantially tangential to the edge of the substrate 101, or substantially tangential to the edge of the substrate supporting surface of the substrate support 138.

In addition, since the substrate 101 is rotated along counter clockwise direction 197, the gas flows over the substrate 101 resulting in greater growth at the edge of the substrate 101. Although FIG. 1B shows the substrate 101 is rotating along counter clockwise direction, the substrate 101 may be rotated along a clockwise direction without losing benefit from the side gas flow 148. The gas velocity of the side gas flow 148, and the gas flow pattern in the processing volume 139, may be adjusted through one or more of a flow rate of the side gas flow 148, a rotation speed of the substrate 101, and the spread angle of the gas injector 147. Controlling aspects of the side gas flow 148 prevents gas flow non-uniformities that may affect how the side gas flow 148 reacts with the main gas flow 145 and the substrate 101. As a result, the thickness profile at the edges of the substrate is improved.

Figure 2A:
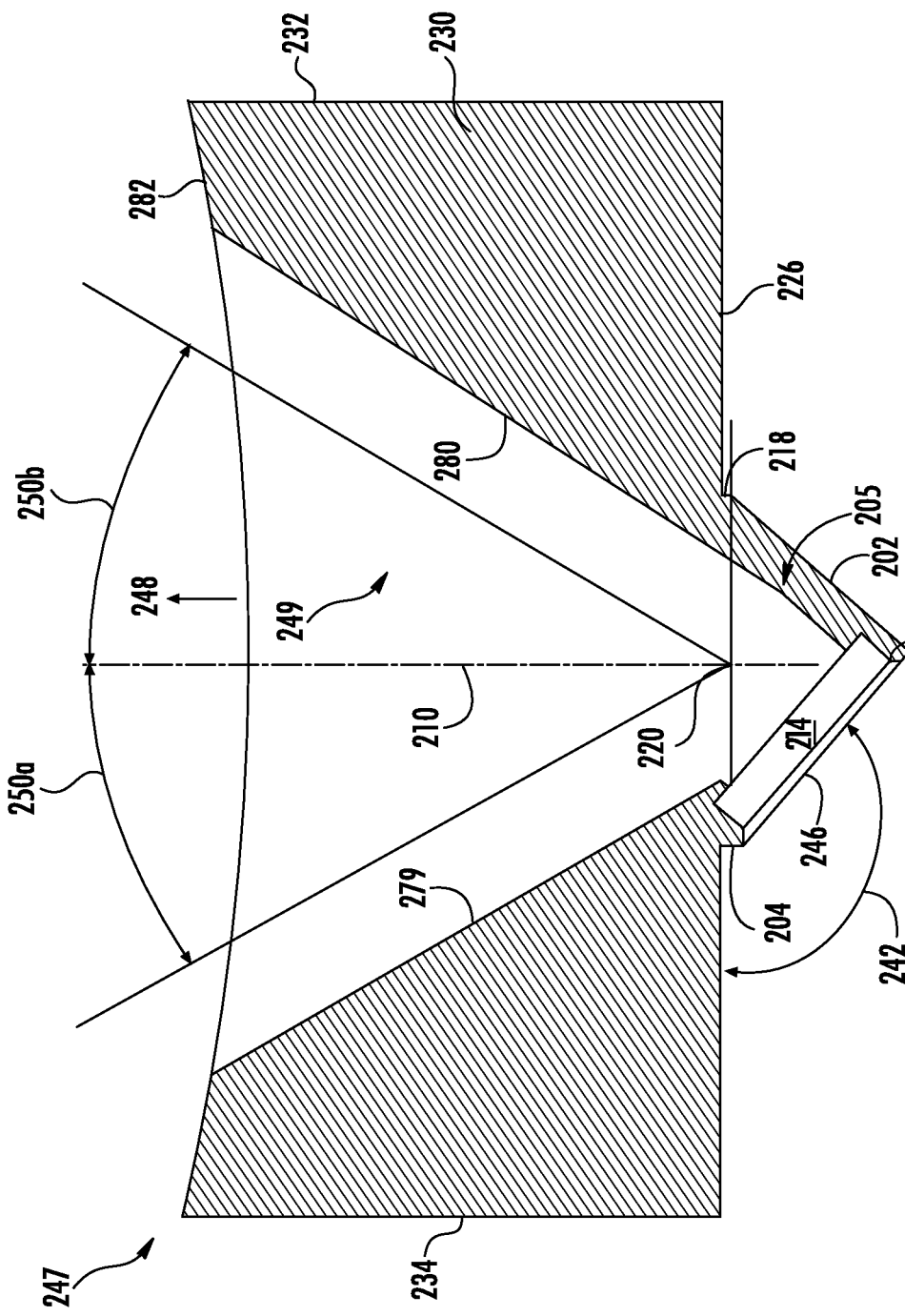
FIG. 2A is a schematic cross-sectional top view of a gas injector according to one implementation of the present disclosure.

The gas injector 147 may be made of any suitable material such as quartz, ceramic, aluminum, stainless steel, steel, or the like. To further increase the effect of the side gas flow at the edge of the substrate 101, the gas injector 147 may be configured to have one or more gas channels pointing to the edge of the substrate 101. FIG. 2A is a schematic cross-sectional top view of a gas injector 247 according to one implementation of the present disclosure.

Figure 2B:
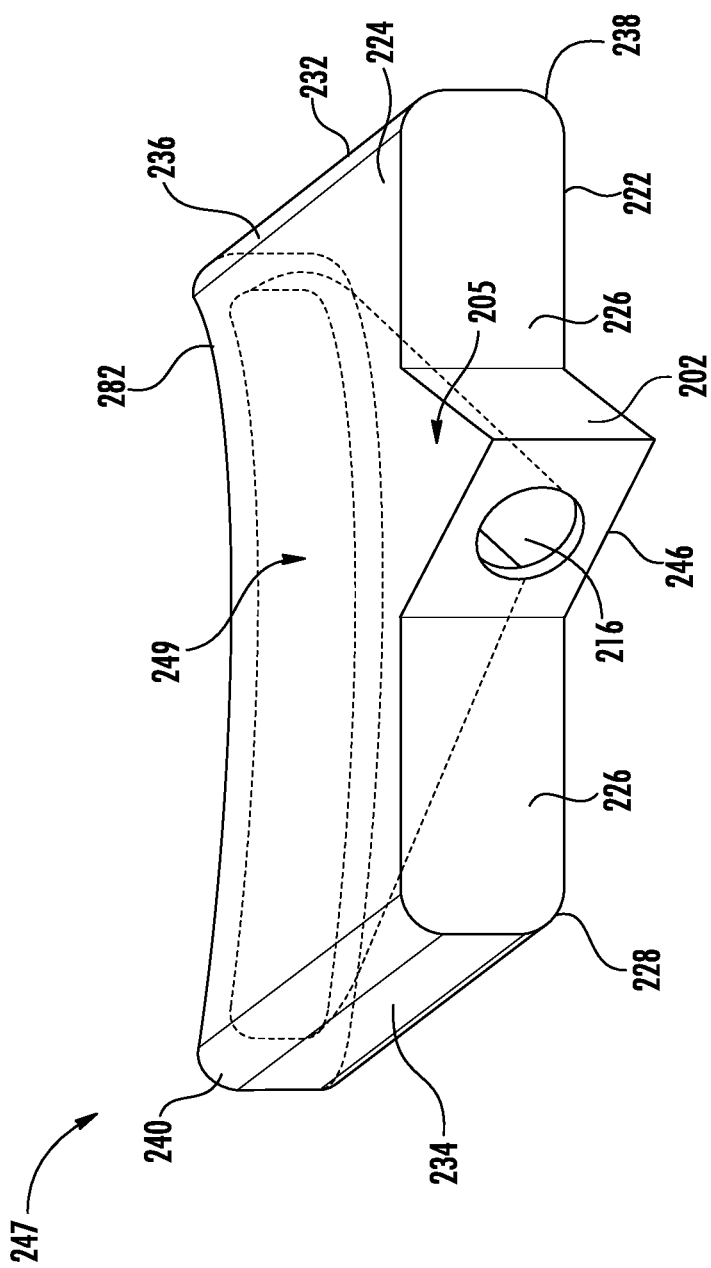
FIGS. 2B and 2C are three-dimensional schematics of the gas injector according to the present disclosure.

In the implementation of FIG. 2A, the gas injector 247 is an elongated structure having a gas channel 249 formed therein. The gas injector 247 has a body 230 and a projection 205. The projection 205 may be triangular in shape. The projection 205 may be a gas source assembly. In one implementation, the projection 205 includes an angled opening 246 with a circular inlet 216, as seen in FIG. 2B, an angled side 202, a first facet 218, and a second facet 204. In one implementation, the angled opening 246 is rectangular. In one implementation, the first facet 218 is parallel to the second facet 204. The second facet 204 may be twice the length of the first facet 218. The second facet may be between 0.040 and 0.048 inches.

In one implementation, the body 230 is rectangular with rounded edges. The body 230 has a first side 232 opposite a second side 234. In one implementation, the first side 232 and the second side 234 are substantially the same length. In one implementation, the first side 232 and the second side 234 are parallel. The body has a third side 224, a fourth side 222, a fifth side 226, and a sixth side 282, as seen in FIG. 2B. The first facet 218 may connect the angled side 202 to the fifth side 226. The second facet may connect the angled opening 246 to the fifth side 226. The projection 205 may connect to the fifth side 226. The angled opening 246 may be perpendicular to the angled side 202.

The gas injector may include an elongated channel with any desired shape in cross-section, such as rectangular, square, round, polygonal, hexagonal, or any other suitable shape. The gas injector 247 is adapted to direct the majority of the side gas flow 148 to the edge of the substrate 101 in the shape of a hollow fan or hollow flattened cone. The gas channel 249 includes two interior surfaces 279, 280. In one implementation, interior surfaces 279, 280 are configured so that each extends along a direction that is substantially tangential to the edge of the substrate 101, or substantially tangential to the edge of the substrate supporting surface of the substrate support 138. Interior surfaces 279, 280 extend from an angled opening 246 to a curved surface 282. The curved surface 282 is adjacent to the substrate 101 and on the opposite side of the projection 205.

The gas channel 249 is angled to provide a side gas flow 248 to the processing volume 139 (FIG. 1B) via the side port 122 (FIG. 1B). The side gas flow 248 flows along a flow path that adjusts edge profile of the substrate 101 being processed. Advantageously and surprisingly, varying the half-angles of the gas channel 249 such that the gas flow pattern of the side gas flow 248 has a non-uniform lateral spread produces a more uniform thickness profile of material deposited on the substrate 101. Thus, the gas channel 249 has two different half-angles 250a and 250b. One half-angle 250a, 250b may be between 29.5 degrees to 30.5 degrees while the other half-angle 250a, 250b may be between 31.8 degrees and 32.8 degrees. The half-angles 250a and 250b are the angle measured using the central axis line 210 of the substrate 101 and the central intersection 220 of the gas channel 249. The central axis line 210 is a line that extends from the center of the substrate 101 to the opening of the gas channel 249. The central axis line 210 is parallel to the first side 232. In one implementation, the central axis line 210 is a line that extends through a point 212 parallel to the first side 232. The point 212 is located on the interior edge of the angled opening 246. The angled opening 246 has a circular inlet 216 (as seen in FIG. 2B). The circular inlet 216 leads to an expanded interior space 214. In one implementation, the expanded interior space 214 is rectangular. In one implementation, the point 212 is at the intersection of the angled opening 246 and the interior space 214. In one implementation, the expanded interior space 214 is communication with the inlet channel 249. The central intersection 220 is the mid-point of the opening of the gas channel 249. The central intersection 220 is defined by a line parallel the fifth side 226 and intersecting the point at which a first facet 218 connects to the angled side 202.

The gas injector 247 has an angled gas source projection 205 in connection with the gas source 152. In one implementation the angled gas source projection 205 is triangular in shape. In one implementation the opening of the angled gas source projection 205 is disposed at an angle 242 that is between about 137 degrees and 141 degrees. In one implementation, the gas channel 249 is configured so that gas or gas of radicals, after exiting the gas channel 249, is flowing in a direction that is substantially tangential to the edge of the substrate 101, or substantially tangential to the edge of the substrate supporting surface of the substrate support 138. It is contemplated that the angle of the gas channel 249 may be adjusted so that the side gas flow 248 is flowing towards the center of the substrate 101 (or substrate support 138), proximate the periphery of the substrate 101 (or substrate support 138), or spatially distributed on the substrate 101 (or substrate support 138) at any desired location.

Regardless of whether the side gas flow 248 (either gas or gas of radicals) is flowed in a direction tangential to, or proximate the edge of the substrate 101 (or the edge of the substrate supporting surface of the substrate support 138), the gas or gas of radicals significantly promote the reaction rate along the edge of the substrate 101. For a RadOx® process that heats the substrate with lamps and injects hydrogen and oxygen into the processing chamber 100 from the slit valve 137, the gas injector 247 is configured to provide a side gas flow 248 at different angles to the substrate 101. Surprisingly, providing side gas at or near the edge of the substrate 101 through a gas channel 249 with non-uniform half-angles leads to an oxide layer having improved thickness uniformity along the edge of the substrate 101.

In one exemplary implementation, the gas injector 247 is configured to have the gas channel 249 pointed to the gas injection side of the processing chamber 100, e.g., the slit valve 137. That is, the gas channel 249 is extended along a direction towards the gas injection side of the processing chamber. In this way, the majority of the gas flows along the side gas flow 248 towards the gas injection side of the processing chamber 100 and reacts with the processing gas(es) coming out of the injection cartridge 149 (FIG. 1B) at or near the edge of the substrate 101 (or the substrate supporting surface of the substrate support 138).

Figure 2C:
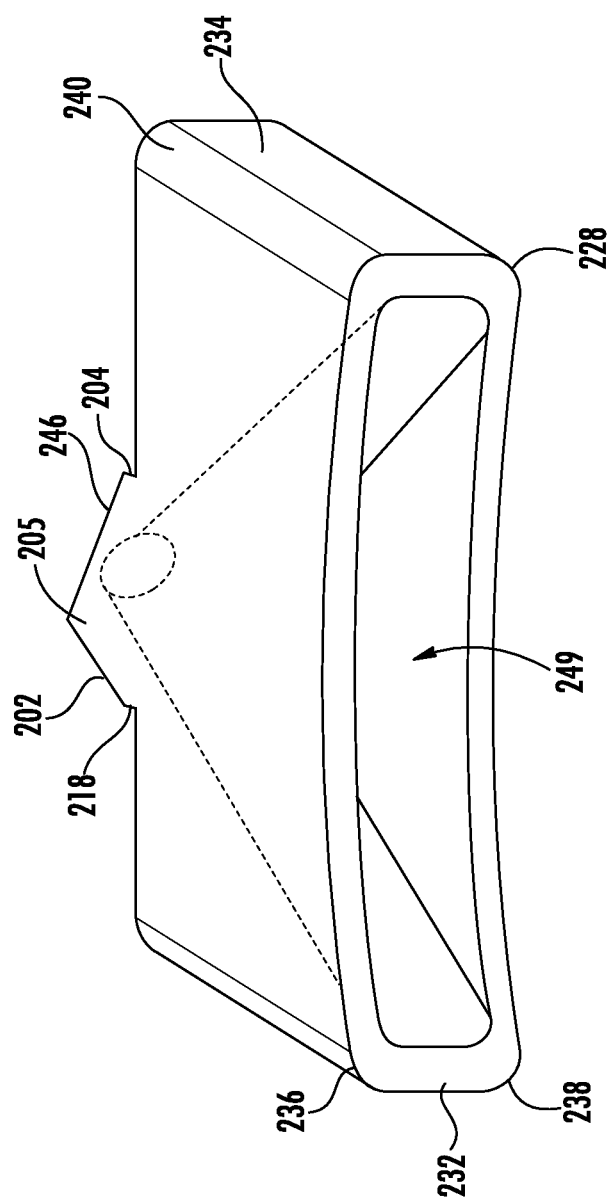

FIGS. 2B and 2C are three-dimensional schematics of the gas injector 247 according to the present disclosure. The gas injector 247 functions to direct majority of gas or gas of radicals flowing along a side gas flow towards the gas injection side of the processing chamber 100 (e.g., the slit valve 137) and the gas exhaust side of the processing chamber 100 (e.g., pump system 136), respectively. Additionally or alternatively, the gas channel 249 may be configured so that the side gas flow 248 flows in a direction that is tangential to, or in a direction proximate the edge of the substrate 101 (or the edge of the substrate supporting surface of the substrate support 138).

The gas injector 247 includes sides 226, 232, 234, 282, 224, and 222. A first side 232 is opposite a second side 234. In one implementation, the first side 232 is parallel to and substantially the same length as the second side 234. A first curved surface 236 is disposed between the first side 232 and the third side 224. The third side 224 is disposed orthogonally to the first side 232. A second curved surface 240 is disposed between the second side 234 and the third side 224. A third curved surface 238 is disposed between the first side 232 and a fourth side 222. The fourth side 222 is orthogonal to the first side 232. A fourth curved surface 228 is disposed between the second side 234 and the fourth side 222. The third side 224 is opposite the fourth side 222. A fifth side 226 is opposite a sixth side 282. In one implementation the sixth side 282 is curved. The radius of curvature of the sixth side 282 may be between about 8 to about 9 inches. The third side 224 is on the same plane as the angled gas source projection 205. The gas channel 249 is disposed on the sixth side 282 facing the substrate 101. Advantageously, the first side 232 and the second side 234 are substantially perpendicular to the fourth side 222 allowing for a more cohesive seal within the chamber 100. One implementation may optionally include facets 204, 218, as seen in FIG. 2C. In one implementation, the angled gas source projection 205 is connected to the fifth side 226 via facets 204, 218. In one implementation, the angled side 202 and the angled opening 246 are directly connected to the fifth side 226. The curvature of the sixth side advantageously promotes a more uniform discernment of gas and less turbulent gas flow towards the substrate 101 by following the curvature of the substrate 101.

Even though a thermal processing chamber is discussed in this application, implementations of the present disclosure may be used in any processing chamber where uniform gas flow is desired.

Benefits of the present disclosure include the use of an improved side gas assembly in a processing chamber to direct gas towards the edge of the substrate to control growth uniformity throughout the substrate, i.e., from the center to the edge. The side gas assembly has an angled gas inlet configured to point to the gas injection side (e.g., slit valve) of the processing chamber and/or the gas exhaust side (e.g., pump system) of the processing chamber. Particularly, it has been surprisingly observed that directing gas through a gas channel with non-uniform half angles will significantly increase the reaction at or near the edge of the substrate in a RadOx® process, thereby leading to an improved thickness uniformity along the edge of the substrate as well as an improved overall thickness uniformity of the substrate.

While the foregoing is directed to implementations of the present disclosure, other and further implementations of the disclosure may be devised without departing from the basic scope thereof, and the scope thereof is determined by the claims that follow.

What is claimed is:

1. An apparatus for thermal processing a substrate, comprising:
   a body, wherein the body comprises:
      a first side;
      a second side opposite the first side, wherein the first side is substantially the same length as the second side;
      a third side orthogonal to the first side;
      a first curved surface extending between the first side and the third side;
      a second curved surface extending between the third side and the second side;
      a fourth side orthogonal to the second side;
      a third curved surface extending between the first side and the fourth side;
      a fourth curved surface extending between the fourth side and the second side, where in the third side is opposite the fourth side;
      a fifth side orthogonal to the first side; and
      a sixth side orthogonal to the first side, wherein the sixth side is opposite the fifth side;
   an angled projection; and
   a gas injection channel comprising:
      a first half-angle; and
      a second half-angle, wherein the first half-angle is different from the second half-angle.

2. The apparatus of claim 1, wherein the angled projection is disposed on the fifth side, and wherein the gas injection channel is disposed on the sixth side.

3. The apparatus of claim 1, wherein the angled projection is triangular.

4. The apparatus of claim 1, wherein the angled projection comprises:
   a first facet; and
   a second facet.

5. The apparatus of claim 4, wherein the angled projection further comprises a circular inlet.

6. The apparatus of claim 5, wherein the circular inlet is in fluid communication with the gas injection channel.

7. The apparatus of claim 1, wherein the first half-angle is between about 29.5 degrees and about 30.5 degrees, and wherein the second half-angle is between about 31.8 degrees and about 32.8 degrees.

8. The apparatus of claim 1, wherein the gas injection channel is a flattened funnel-shaped structure that spreads out towards the processing volume.

9. An apparatus for processing a substrate, comprising:
   a chamber body defining a processing volume;
   a substrate support disposed in the processing volume, wherein the substrate support has a substrate supporting surface;
   a gas source projection coupled to an inlet of the chamber body;
   an exhaust assembly coupled to an outlet of the chamber body; and
   a side gas assembly coupled to a sidewall of the chamber body, the side gas assembly comprising:
      a body, wherein the body comprises:
         a first side;
         a second side opposite the first side, wherein the first side is substantially the same length as the second side;
         a third side orthogonal to the first side;
         a first curved surface extending between the first side and the third side;
         a second curved surface extending between the third side and the second side;
         a fourth side orthogonal to the second side;
         a third curved surface extending between the first side and the fourth side;
         a fourth curved surface extending between the fourth side and the second side, where in the third side is opposite the fourth side;
         a fifth side orthogonal to the first side; and
         a sixth side orthogonal to the first side, wherein the sixth side is opposite the fifth side;
      an angled projection; and
      a gas injection channel, comprising:
         a first half-angle; and
         a second half-angle, wherein the first half-angle is different from the second half-angle.

10. The apparatus of claim 9, wherein the angled projection is disposed on the fifth side, and wherein the gas injection channel is disposed on the sixth side.

11. An apparatus for processing a substrate, comprising:
   a chamber body defining a processing volume;
   a substrate support disposed in the processing volume, wherein the substrate support has a substrate supporting surface;

a gas source projection coupled to an inlet of the chamber body;

an exhaust assembly coupled to an outlet of the chamber body; and a side gas assembly coupled to a sidewall of the chamber body, the side gas assembly comprising:
  a body,
  an angled projection, wherein the angled projection comprises:
    a first facet; and
    a second facet; and
  a gas injection channel, comprising:
    a first half-angle; and
    a second half-angle, wherein the first half-angle is different from the second half-angle.

12. The apparatus of claim 11, wherein the angled projection further comprises a circular inlet.

13. The apparatus of claim 12, wherein the circular inlet is in fluid communication with the gas injection channel.

14. The apparatus of claim 9, wherein the side gas assembly provides a gas flow along a flow path that is at a distance of about 5 mm to about 10 mm from a tangent line of the substrate supporting surface parallel to the flow path.

15. The apparatus of claim 9, wherein the first half-angle is between about 29.5 degrees and about 30.5 degrees, and wherein the second half-angle is between about 31.8 degrees and about 32.8 degrees.

16. The apparatus of claim 9, wherein the gas injection channel is a funnel-shaped structure that spreads out towards the processing volume.

17. The apparatus of claim 9, wherein the angled projection further comprises a circular inlet, and wherein the circular inlet is in fluid communication with the gas injection channel.

18. The apparatus of claim 11, wherein the side gas assembly provides a gas flow along a flow path that is at a distance of about 5 mm to about 10 mm from a tangent line of the substrate supporting surface parallel to the flow path.

19. The apparatus of claim 11, wherein the first half-angle is between about 29.5 degrees and about 30.5 degrees, and wherein the second half-angle is between about 31.8 degrees and about 32.8 degrees.

20. The apparatus of claim 11, wherein the gas injection channel is a funnel-shaped structure that spreads out towards the processing volume.

\* \* \* \* \*

UNITED STATES PATENT AND TRADEMARK OFFICE
CERTIFICATE OF CORRECTION

PATENT NO. : 10,752,991 B2  
APPLICATION NO. : 15/877048  
DATED : August 25, 2020  
INVENTOR(S) : Eric Kihara Shono It is certified that error appears in the above-identified patent and that said Letters Patent is hereby corrected as shown below:

In the Claims

In Column 9, Line 20, in Claim 14, delete "claim 9," and insert -- claim 11, --, therefor.

In Column 10, Line 1, in Claim 15, delete "claim 9," and insert -- claim 11, --, therefor.

In Column 10, Line 5, in Claim 16, delete "claim 9," and insert -- claim 11, --, therefor.

In Column 10, Line 12, in Claim 18, delete "claim 11," and insert -- claim 9, --, therefor.

In Column 10, Line 16, in Claim 19, delete "claim 11," and insert -- claim 9, --, therefor.

In Column 10, Line 20, in Claim 20, delete "claim 11," and insert -- claim 9, --, therefor.

Signed and Sealed this  
Twentieth Day of October, 2020

Andrei Iancu  
*Director of the United States Patent and Trademark Office*